United States Patent
Molas et al.

(10) Patent No.: US 9,633,725 B2
(45) Date of Patent: Apr. 25, 2017

(54) METHOD FOR DETERMINING ELECTRICAL PARAMETERS USED TO PROGRAMME A RESISTIVE RANDOM ACCESS MEMORY

(71) Applicant: Commissariat à l'énergie atomique et aux énergies alternatives, Paris (FR)

(72) Inventors: Gabriel Molas, Grenoble (FR); Jérémy Guy, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 322 days.

(21) Appl. No.: 14/565,486

(22) Filed: Dec. 10, 2014

(65) Prior Publication Data

US 2015/0162081 A1 Jun. 11, 2015

(30) Foreign Application Priority Data

Dec. 11, 2013 (FR) ...................... 13 62421

(51) Int. Cl.
G11C 11/00 (2006.01)
G11C 13/00 (2006.01)
G11C 7/10 (2006.01)

(52) U.S. Cl.
CPC ........ G11C 13/0069 (2013.01); G11C 7/1078 (2013.01); G11C 13/0011 (2013.01); G11C 13/0035 (2013.01)

(58) Field of Classification Search
CPC ....................................... G11C 13/0002–13/00
USPC ................. 365/148, 163, 171, 173
See application file for complete search history.

(56) References Cited

U.S. PATENT DOCUMENTS

| | | | |
|---|---|---|---|
| 2005/0243633 A1 | 11/2005 | Symanczyk | |
| 2012/0201069 A1 | 8/2012 | Honda | |
| 2013/0250657 A1 | 9/2013 | Haukness et al. | |
| 2014/0036572 A1* | 2/2014 | Takagi | G11C 13/0007 365/148 |
| 2014/0226388 A1* | 8/2014 | Khoueir | G11C 13/0004 365/148 |

OTHER PUBLICATIONS

E. Vianello et al., "On the impact of Ag doping on performance and reliability of GeS₂-based Conductive Bridge Memories," Solid-State Device Research Conference (ESSDERC), 2012 Proceedings of the European IEEE, Sep. 17, 2012, pp. 278-281.
D. Ielmini et al., "Trade-Off Between Data Retention and Reset in NiO RRAMs," Reliability Physics Symposium (IRPS), 2010 IEEE International, IEEE, May 2, 2010, pp. 620-626.
T. Ninomiya et al., "Conductive Filament Scaling of TaO$_x$ Bipolar ReRAM for Long Retention with Low Current Operation," 2012 Symposium on VLSI Technology Digest of Technical Papers, IEEE, 2012, pp. 73-74.
Z. Wei et al, "Demonstration of High-density ReRAM Ensuring 10-year Retention at 85°C Based on a Newly Developed Reliability Model," IEEE, 2011, 4 pages.
Preliminary Search Report issued in French Patent Application No. 1362421, dated Aug. 4, 2014.

* cited by examiner

*Primary Examiner* — Han Yang
(74) *Attorney, Agent, or Firm* — Pillsbury Winthrop Shaw Pittman LLP

(57) ABSTRACT

A method determines electrical parameters for programming a resistive random access memory in an insulating state and in a conducting state, by formation or dissolution of a filament.

8 Claims, 6 Drawing Sheets

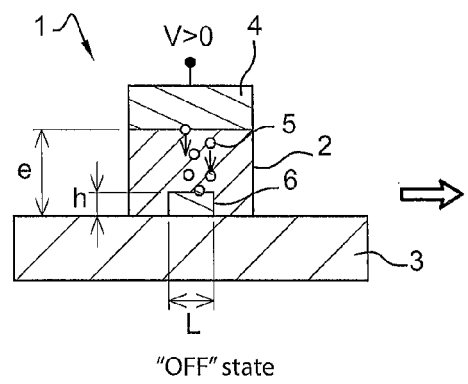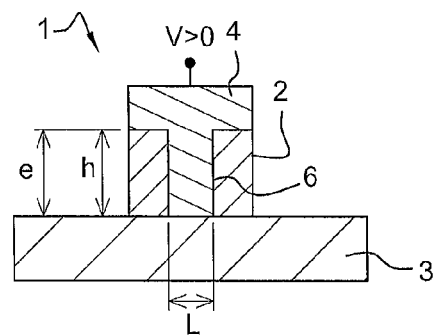
Fig. 1A "OFF" state  Fig. 1B "ON" state
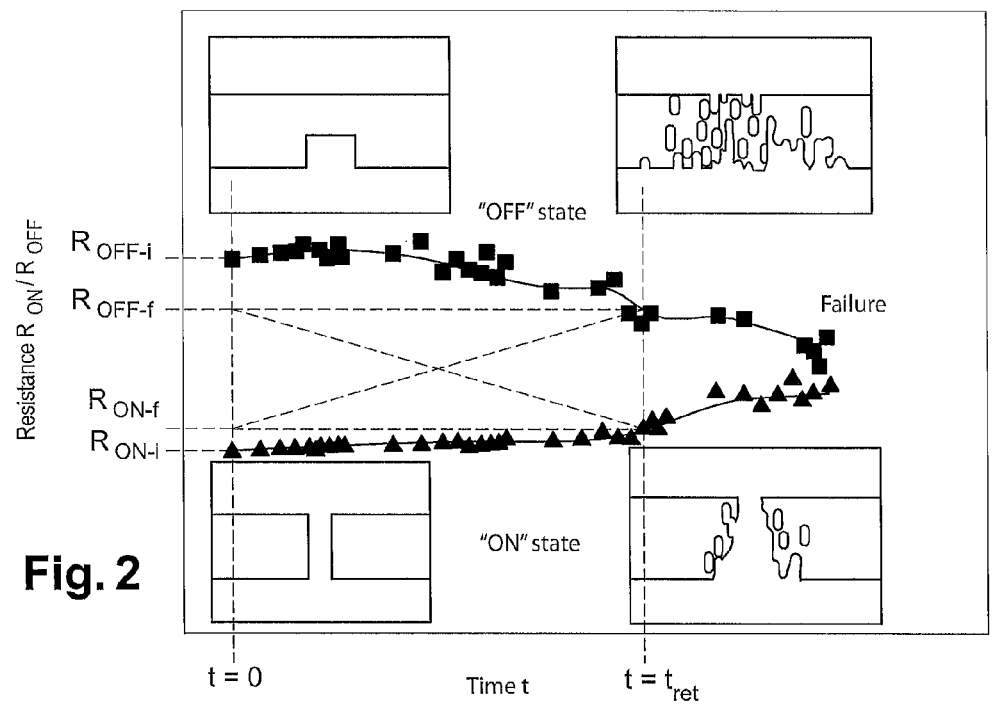
Fig. 2

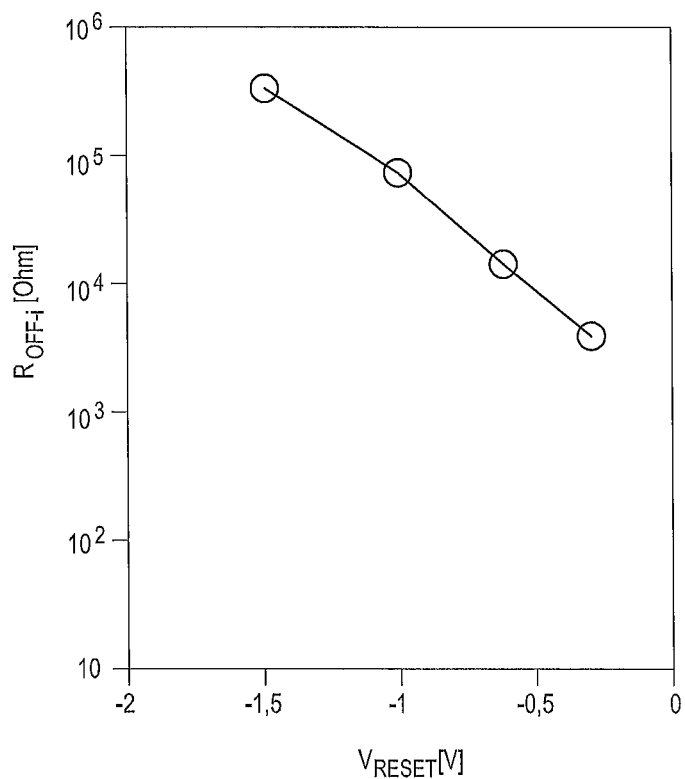
Fig. 6
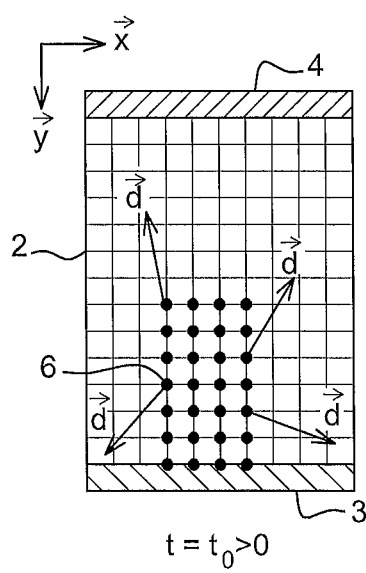 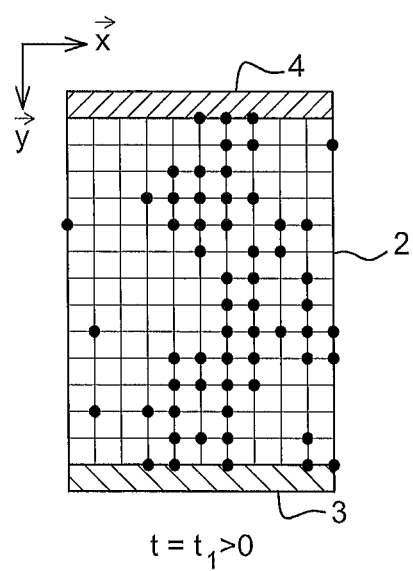
Fig. 7A  Fig. 7B

METHOD FOR DETERMINING ELECTRICAL PARAMETERS USED TO PROGRAMME A RESISTIVE RANDOM ACCESS MEMORY

CROSS REFERENCE TO RELATED APPLICATIONS

This application claims the benefit of priority from French Patent Application No. 1362421 filed on Dec. 11, 2013, the entire content of which is incorporated herein by reference.

FIELD

The present invention relates to the field of rewritable non-volatile memories and, more specifically, that of resistive random access memories. A resistive random access memory comprises first and second electrodes separated by a layer made of electrically insulating material, and passes from an insulating state to a conducting state by formation of a conducting filament between the first and second electrodes.

BACKGROUND

Resistive random access memories (RRAM) are today the subject of considerable attention, particularly on account of their low electrical consumption and their high operating speed.

A resistive type memory cell has at least two states: a High Resistance State (HRS), also known as "OFF" state, and a Low Resistance State (LRS) or "ON" state. It may thus be used to store binary information.

Three types of resistive memories may be distinguished: memories based on thermochemical mechanism, memories, based on valence change, and memories based on electrochemical metallisation.

The field of the present invention more particularly relates to this latter category based on ionic conduction materials (CBRAM or Conductive Bridging RAM memories). The operation resides in the reversible formation and rupture of a conducting filament in a solid electrolyte, by dissolution of a soluble electrode. These memories are promising by virtue of their low programming voltages (of the order of one Volt), their short programming time (<1 µs), their low consumption and their low integration cost. Furthermore, these memories may be integrated, in the metallisation levels of the logic of a circuit ("above IC"), which makes it possible to increase the integration density of the circuit. From the architectural viewpoint, they only require a selection device, a transistor or a diode for example.

The operation of CBRAM memories is based on the formation, within a solid electrolyte, of one or more metal filaments (also known as "dendrites") between two electrodes, when these electrodes are taken to suitable potentials. The formation of the filament makes it possible to obtain a given electrical conduction between the two electrodes. By modifying the potentials applied to the electrodes, it is possible to modify the distribution of the filament, and thus to modify the electrical conduction between the two electrodes. For example, by reversing the potential between the electrodes, it is possible to make the metal filament disappear or reduce, so as to eliminate or reduce considerably the electrical conduction due to the presence of the filament.

FIGS. 1A and 1B are schematic diagrams of a memory device 1 of CBRAM type, respectively in the "OFF" state and in the "ON" state.

This device 1 is formed of a stack of Metal/Ion conductor/Metal type. It comprises a solid electrolyte 2, for example based on doped chalcogenide (e.g. GeS) or oxide (e.g. $Al_2O_3$). The electrolyte 2 is arranged between a bottom electrode 3, for example made of Pt, forming an inert cathode, and a top electrode 4 comprising a portion of ionisable metal, for example copper, and forming an anode. A portion of ionisable metal is a portion of metal able to form metal ions (here $Cu^{2+}$ ions), when it is subjected to a suitable electrical potential. The device 1 represented in FIG. 1A or 1B typically forms a memory point, that is to say a unit memory cell, of a memory comprising a multitude of these memory devices.

As indicated previously, the memory state of a CBRAM memory device results from the difference in electrical resistivity between two states: "ON" and "OFF".

In the "OFF" state (FIG. 1A), the metal ions (here $Cu^{2+}$ ions for a soluble electrode comprising Cu) coming from the portion of ionisable metal are dispersed throughout the solid electrolyte 2. Thus, no electrical contact is established between the cathode 3 and the anode 4, that is to say between the top electrode and the bottom electrode. The solid electrolyte comprises an electrically insulating zone of high resistivity between the anode and the cathode.

When a positive potential V is applied to the soluble top electrode 4 (the anode), an oxidation-reduction reaction takes place at this electrode, creating mobile ions 5 (FIG. 1A). In the case of a copper electrode 4, the following reaction takes place:

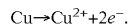

The ions 5 then move in the electrolyte 2 under the effect of the electric field applied to the electrodes. The speed of movement depends on the mobility of the ion in the electrolyte in question, which guides the choice of the soluble electrode/electrolyte couple (examples: Ag/GeS; $Cu/Al_2O_3$, etc.). The speeds of movement of the ions are of the order of nm/ns.

On arriving at the inert electrode 3 (the cathode), the ions 5 are reduced by virtue of the presence of electrons supplied by the electrode 3, leading to the growth of a metal filament 6 according to the following reaction:

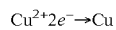

The filament 6 grows preferentially in the direction of the soluble electrode 4.

The memory 1 then passes to the "ON" state (FIG. 1B) when the filament 6 enables contact between the electrodes 3 and 4, making the stack conducting. This phase is called "SET phase" of the memory.

In order to pass to the "OFF" state ("RESET" phase of the memory), a negative voltage V is applied to the top electrode 4, leading to the dissolution of the conducting filament. To account for this dissolution, thermal (heating) and oxidation-reduction mechanisms are generally invoked.

Often, the electrolyte 2 contains in the "OFF" state a residual filament 6 in contact with the cathode 3. This comes from the preceding SET phase and has not been dissolved completely during the RESET of the memory. The filament is called residual when it does not establish sufficient electrical conduction between the electrodes to obtain the "ON" state.

Numerous studies are concerned with these CBRAM memories to improve their electrical performance. Among the solutions proposed, in particular may be cited the engineering of the electrolyte (addition of dopants, choice of new materials, annealings, UV treatments, etc.), the engineering of the soluble electrode and the inert electrode or the addition of interface(s) between the electrodes and the electrolyte.

Another area of development relates to the retention of information, that is to say the retention of the "OFF" state and the "ON" state. It is sought to improve the stability of the insulating and conducting states, especially for high operating temperatures.

SUMMARY

An aspect of the invention aims to guarantee the stability of the conducting and insulating states of a resistive random access memory, over a given retention time.

This aspect tends to be met by choosing particular values of electrical parameters to program the resistive random access memory in its insulating state and in its conducting state.

An embodiment of the invention relates to a method for determining these program parameters, comprising the following steps:
  supplying a set of parameters comprising a target retention time of the insulating and conducting states, a maximum resistance value in the conducting state and a minimum resistance value in the insulating state;
  simulating retention curves of the conducting state corresponding to different dimensions of filament, each retention curve of the conducting state representing the increase in the resistance in the conducting state as a function of a retention time;
  determining the retention curve of the conducting state reaching the maximum resistance value in the conducting state after a retention time equal to the target retention time;
  determining an initial resistance value in the conducting state from said retention curve of the conducting state;
  determining the programming parameter of the conducting state from the initial resistance value in the conducting state;
  simulating retention curves of the insulating state corresponding to different dimensions of filament, each retention curve of the insulating state representing the reduction in the resistance in the insulating state as a function of the retention time;
  determining the retention curve of the insulating state reaching the minimum resistance value in the insulating state after a retention time equal to the target retention time;
  determining an initial resistance value in the insulating state from said retention curve of the insulating state; and
  determining the programming parameter of the insulating state from the initial resistance value in the insulating state.

In an embodiment, the retention curves of the conducting state correspond to different initial widths of filament, the filament having an initial height equal to the thickness of the layer made of electrically insulating material.

The method then beneficially comprises a step of determining an optimal width of filament corresponding to the retention curve of the conducting state and the retention curves of the insulating state may be simulated for a filament having an initial width equal to the optimal width and a variable initial height.

In an embodiment, the retention curves of the conducting state and the insulating state are obtained by carrying out, for different retention times, the following steps:
  simulating a diffusion of the atoms forming the filament;
  calculating the concentration of atoms in different portions of the layer made of electrically insulating material;
  calculating, from the concentration of atoms, the equivalent electrical resistivity in each portion; and
  calculating an overall resistance of the memory from the equivalent electrical resistivities of the different portions of the layer made of electrically insulating material.

The method according to an embodiment of the invention may also have one or more of the characteristics below, considered individually or according to all technically possible combinations thereof:
  the initial resistance value in the conducting state is obtained by determining the Y-intercept of the retention curve of the conducting state;
  the initial resistance value in the insulating state is obtained by determining the Y-intercept of the retention curve of the insulating state; and
  the first electrode is made of an inert material, the second electrode is made of a soluble material and the electrically insulating material is an ion conducting material, the conducting filament being formed of atoms of the material of the soluble electrode.

Another aspect of the invention relates to a computer program comprising machine executable instructions for implementing the method.

BRIEF DESCRIPTION OF THE FIGURES

Other characteristics and benefits of the invention will become clear from the description that is given thereof below, by way of indication and in no way limiting, with reference to the appended figures, among which:
FIGS. 1A and 1B represent a CBRAM memory cell respectively in the "OFF" state and in the "ON" state;
FIG. 2 represents a retention curve of the "ON" state and a retention curve of the "OFF" state, as well as the corresponding shapes of filament in each state;
FIG. 6 is an abacus $R_{OFF}$ ($V_{RST}$) that can be used at step F9 of the method of FIG. 3;
FIGS. 7A and 7B represent, at two times $t_0$ and $t_1$, the distribution of the atoms of a metal filament in a electrolyte layer of the resistive memory.

For greater clarity, identical or similar elements are marked by identical reference signs in all of the figures.

DETAILED DESCRIPTION

Figure 3:
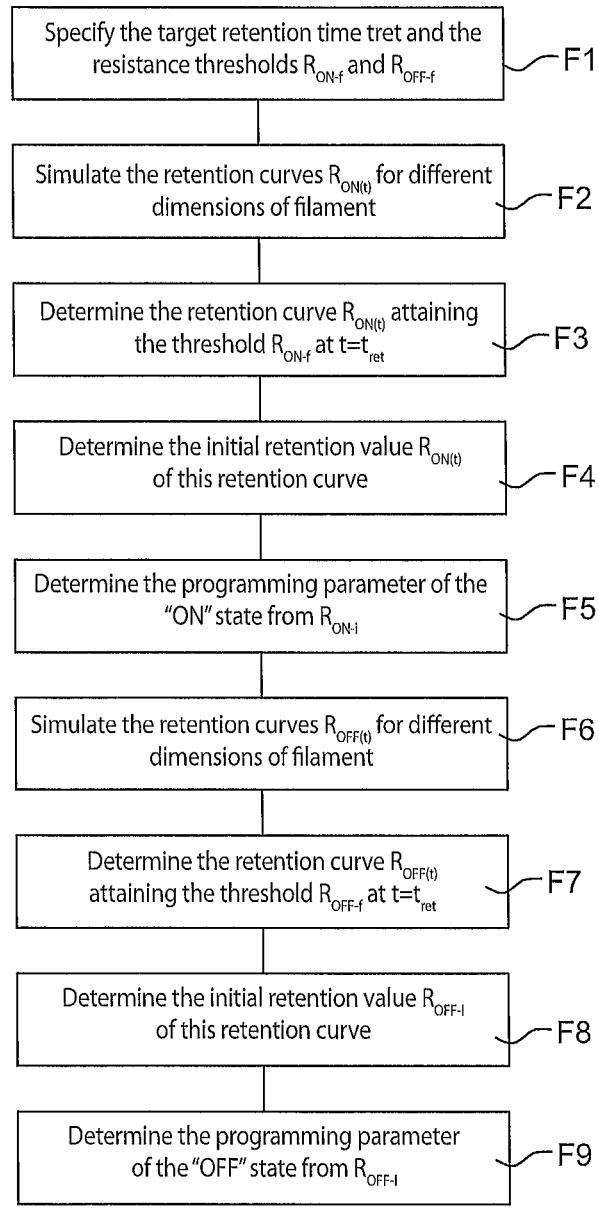
FIG. 3 represents steps F1 to F9 of a method according to an embodiment of the invention, allowing to determine the programming parameters of a resistive memory.

In the following description, the example is taken of a CBRAM resistive memory cell 1 as described previously in FIGS. 1A and 1B. The memory 1 comprises a layer of solid electrolyte 2 made of an ion conducting and electrically insulating material, a first electrode 3 made of an inert material (the cathode) and a second electrode 4 made of a soluble material (the anode). The electrolyte layer 2, of thickness e, is arranged between the electrodes 3 and 4.

The memory passes from an insulating "OFF" state (or HRS) (FIG. 1A) to a conducting "ON" state (or LRS) (FIG. 1B), by formation of a conducting filament 6 between the electrodes 3 and 4. The filament 6 grows in the direction of the soluble electrode 4. It is formed of ions of the material of the soluble electrode 4, for example a metal, which diffuse in the electrolyte 2 under the action of electrical potentials applied to the electrodes. Conversely, it passes from the "ON" state to the "OFF" when the metal filament 6 is dissolved in the electrolyte 2.

The filament 6 may have different shapes (parallelepiped, cylindrical, etc.), as a function especially of the shapes and dimensions of the electrolyte layer 2 and the electrodes 3 and 4. Seen in section in FIGS. 1A and 1B, the filament 6 has the shape of a rectangle. "Height" hereafter designates the dimension h of the filament (visible in FIGS. 1A and 1B) along a direction perpendicular to the planes of the electrodes 3 and 4. "Width" designates the dimension L of the filament along a direction parallel to the planes of the electrodes and contained in the sectional plane of FIGS. 1A and 1B. When the filament has overall the shape of a cylinder, the width L actually corresponds to the diameter of the cylinder.

The retention of the "OFF" or "ON" state of a resistive memory may be represented by plotting the change of the resistance of the memory in this state as a function of time.

FIG. 2 gives an example of retention curve of the "ON" state (lower curve $R_{ON}(t)$) and an example of retention curve of the "OFF" state (upper curve $R_{OFF}(t)$), for a CBRAM type memory.

In the initial state (t=0), that is to say immediately after having formed the conducting filament, the resistance $R_{ON}$ of the memory in the "ON" state is minimal. This initial value is noted $R_{ON-i}$. Then, over time, the resistance in the "ON" state increases to reach a first resistance threshold $R_{ON-f}$ after a certain retention time $t_{ret}$. From this threshold, it is considered that the electrical conduction assured by the filament is no longer satisfactory and that the memory is in a failure state. In other words, the "ON" state degrades progressively and ends at $t=t_{ret}$.

Conversely, the resistance in the "OFF" state, noted $R_{OFF}$, is initially maximal ($R_{OFF-i}$), then diminishes progressively. The "OFF" state weakens to a second resistance threshold $R_{OFF-f}$ also defined for a time t equal to the retention time $t_{ret}$.

Thus, the insulating and conducting states of the memory may be defined by resistance thresholds. The insulating "OFF" state corresponds to a resistance of the memory greater than the resistance threshold $R_{OFF-f}$ whereas the conducting "ON" state corresponds to a resistance less than the resistance threshold $R_{ON-f}$.

Between the thresholds $R_{OFF-f}$ and $R_{ON-f}$ that is to say for a resistance less than the threshold $R_{OFF-f}$ and greater than the threshold $R_{ON-f}$ it is no longer possible to distinguish the state of the memory. Consequently, the information that it contained is lost. The thresholds $R_{ON-f}$ and $R_{OFF-f}$ thus define a residual memory window, represented in dashed lines in FIG. 2, for a given retention time ($t_{ret}$). At each instant during the retention time, the memory cell has a resistance (noted $R_{ON}$ or $R_{OFF}$ depending on its state) outside of this window in order to guarantee the integrity of the data that are recorded therein.

As an illustration, beside the curves of FIG. 2 is represented the shape of the filament in each of the "ON" and "OFF" states, at t=0 and after a retention time $t_{ret}$ (t=$t_{ret}$).

At time t=0, the filament in the "ON" state connects the two electrodes. Its height is equal to the thickness of the electrolyte, that is to say to the distance separating the electrodes. At time t=$t_{ret}$, the filament has dispersed in the electrolyte, mainly due to lateral diffusion (i.e. in a direction parallel to the plane of the electrodes) of the atoms constituting the filament, which explains a higher resistance.

Similarly, the residual filament in the "OFF" state is clearly delimited at t=0. Its height is considerably less than the thickness of the electrolyte, such that an insulating portion of electrolyte separates the two electrodes. Then, the atoms of the metal forming the residual filament diffuse, laterally and in the direction of the top electrode. As a result, at t=$t_{ret}$, the portion of electrolyte separating the initial residual filament from the top electrode has been partially filled with metal. It has become, consequently, less insulating.

The stability of the conducting and insulating states, that is to say the slope of the curves of FIG. 2, depends on the initial shape of the conducting filament (in the conducting state) and of the residual filament (in the insulating state). Indeed, it has been observed that the greater the width of the conducting filament, the lower the resistance in the "ON" state $R_{ON}$ and the more stable this state is. Moreover, the lower the height of the residual filament in the electrolyte, the higher the resistance in the insulating state $R_{OFF}$ and the more stable the insulating state is.

On the basis of this observation, it is possible to determine the initial shapes of the conducting filament and the residual filament which guarantee the retention of the conducting and insulating states during a "target" retention time. The target retention time is, in general, expressed for a certain operating temperature. It is, for example, 10 years (for most non-volatile memory applications) at a temperature of 85° C. or 150° C.

Besides, it is known that the shape of the filament is determined by the programming conditions of the memory in the "ON" state and the "OFF" state. For example, the higher the write current $I_{SET}$, the wider the conducting filament connecting the electrodes. Moreover, the higher the erase voltage, the smaller the residual filament. A method has thus been implemented that determines these programming conditions, knowing the residual memory window desired by the manufacturer, that is to say the resistance thresholds not to exceed and the target retention time.

FIG. 3 is a block diagram representing the different steps F1 to F9 of such a determination method.

The user defines during a first step F1 the set of parameters that will serve as a basis for the determination of the programming conditions. This set of parameters includes the target retention time $t_{ret}$ of the insulating and conducting states, the first resistance threshold in the conducting state $R_{ON-f}$ and the second resistance threshold $R_{OFF-f}$ in the insulating state.

As indicated previously, the threshold $R_{ON-f}$ corresponds to a maximum resistance value of the "ON" state and the threshold $R_{OFF-f}$ corresponds to a minimum resistance value of the "OFF" state.

At step F2, retention simulations of the "ON" state are carried out, by varying a dimension of the conducting filament. Thus, a plurality of retention curves, corresponding to different dimensions of filament, is obtained. Each retention curve represents, as in the example of FIG. 2, the increase in resistance $R_{ON}$ as a function of a retention time t. This increase in resistance reflects the dispersion of the metal filament in the electrolyte over time.

In an embodiment, the retention curves $R_{ON}(t)$ simulated at step F2 correspond to different initial widths L of filament. The initial height h of the filament is on the contrary constant between the simulations and equal to the thickness e of the electrolyte layer.

Figure 4:
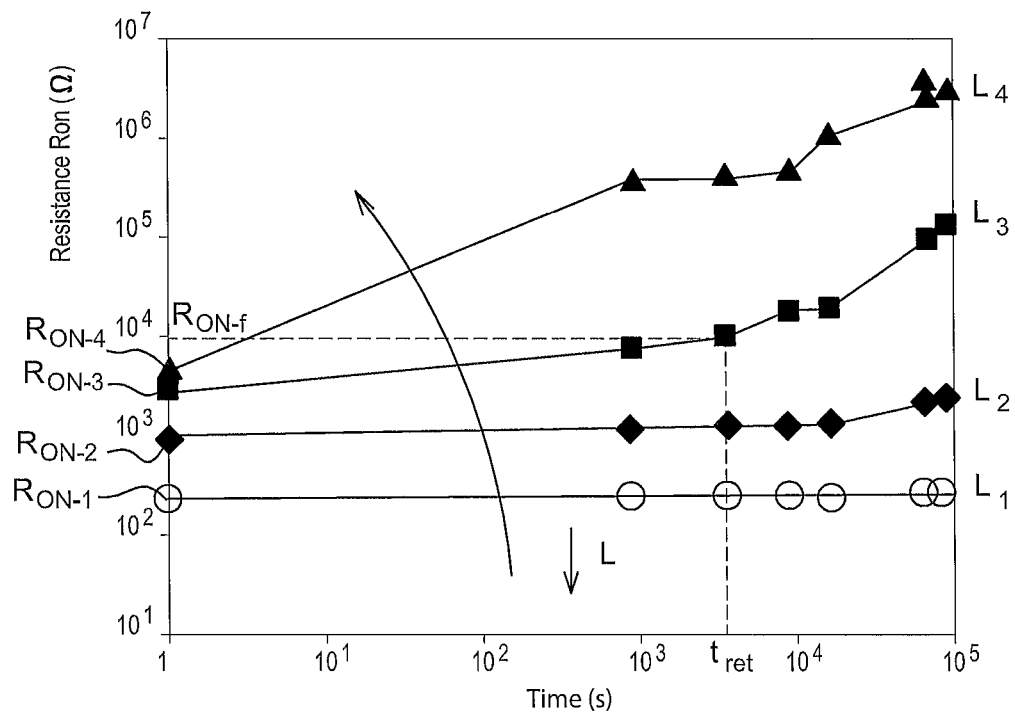
FIG. 4 represents retention curves of the "ON" state obtained at step F2 of the method of FIG. 3.

FIG. 4 represents, in a simplified manner, a series of curves obtained for different widths $L_1$, $L_2$, $L_3$ and $L_4$ of filament. Arranged from bottom to top, the four curves correspond to a decreasing width L of filament ($L_1 > L_2 > L_3 > L_4$).

Each width of filament $L_1$, $L_2$, $L_3$ and $L_4$ corresponds to a value of the initial resistance $R_{ON-i}$, i.e. the Y-intercept of the curve $R_{ON}(t)$. These Y-intercepts are noted respectively $R_{ON-1}$, $R_{ON-2}$, $R_{ON-3}$ and $R_{ON-4}$ in FIG. 4 and may be calculated, according to the following relation:

$$R_{ON-i} = \frac{\rho \cdot h}{L} \quad (1)$$

in which ρ is the electrical resistivity of the filament, h is the height of the filament (equal to e) and L its width (equal to one of the values $L_1$ to $L_4$). This relation is derived from Ohm's law, normally expressed for an object in three dimensions in the form:

$$R = \frac{\rho \cdot h}{S}$$

To simplify the retention analysis, and especially to reduce the calculation time, only two dimensions of the filament are considered here, the dimensions h and L in the plane of FIGS. 1A and 1B. Thus, the surface area S of the section of the filament is here replaced by the width L of the filament.

Since the widths $L_1$, $L_2$, $L_3$ and $L_4$ differ from each other, the initial values $R_{ON-1}/R_{ON-2}$, $R_{ON-3}$ and $R_{ON-4}$ constitute different starting points for the retention curves.

Moreover, the curves of FIG. 4 have different slopes, since the retention increases with the reduction in the initial resistance $R_{ON-i}$ (the lower the initial resistance $R_{ON-i}$, the more stable the "ON" state). The result is that two retention curves cannot intersect.

The temperature at which these retention measurements are carried out may be different to the nominal operating temperature of the memory cell. It may in particular be a temperature known as "acceleration temperature" well above the operating temperature. The acceleration temperature is generally comprised between 70° C. and 300° C., for example 200° C. It makes it possible to accelerate the diffusion of the atoms of the filament, and thus the degradation of the conducting and insulating states. It is in this way possible to study the retention of a memory cell in a very short time (several days).

Step F3 of FIG. 3 consists in determining, among the retention curves $R_{ON}(t)$ simulated at step F2, that which reaches the resistance threshold $R_{ON-f}$ at the end of a retention time t equal to the target retention time $t_{ret}$, in other words that which passes through the coordinate point {$t_{ret}$, $R_{ON-f}$}. For each retention analysis, only a single curve can exist which satisfies this condition (since the curves do not overlap).

At step F4, the initial resistance $R_{ON-i}$ of the curve selected at step F3 is determined, for example by simply noting its Y-intercept. In the example of FIG. 4, the curve passing through the threshold $R_{ON-f}$ after a duration $t_{ret}$ is the third curve having for Y-intercept the resistance $R_{ON-3}$.

Then, in F5, the electrical programming parameter of the "ON" state is determined, which allows to obtain this initial resistance. This parameter is, in an embodiment, an electrical current applied during the writing (or SET phase) of the memory: $I_{SET}$. The write current $I_{SET}$ determines to what extent the conducting filament is narrow or wide, which, as will be appreciated by the skilled artisan, has an effect on its electrical resistance.

The determination of step F5 is, in an embodiment, carried out by means of an abacus. This abacus represents the initial resistance in the "ON" state for different values of the electrical programming parameter.

Figure 5:
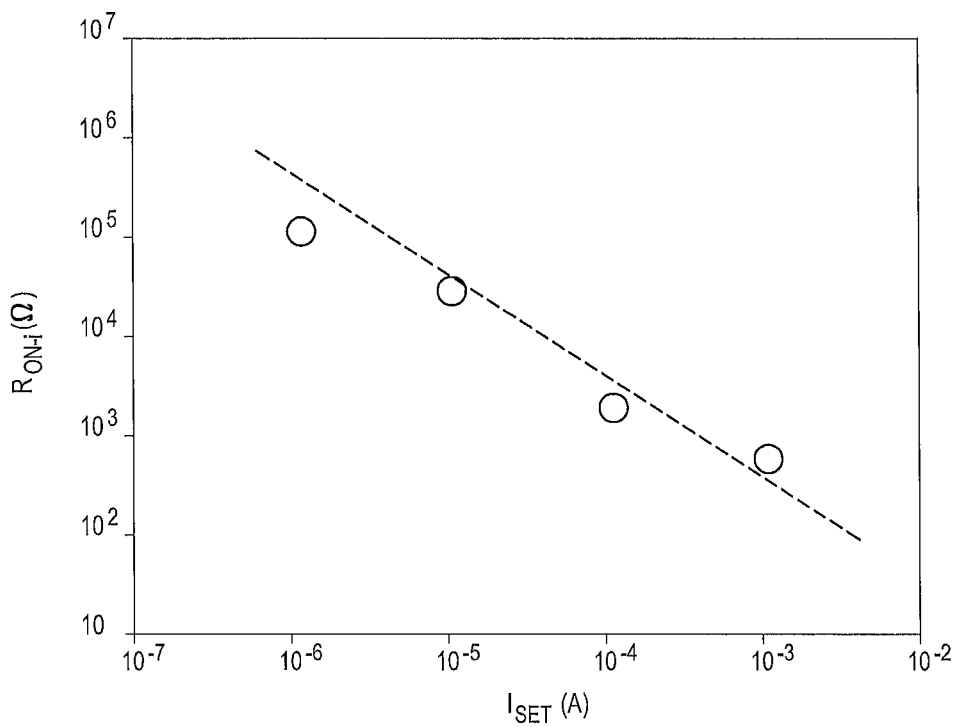
FIG. 5 is an abacus $R_{ON}$ ($I_{SET}$) that can be used at step F5 of the method of FIG. 3.

FIG. 5 gives an example of abacus. It represents the initial resistance $R_{ON-i}$ as a function of the write current $I_{SET}$. This type of abacus may be constructed, in advance, by applying a current ramp to a reference CBRAM memory cell and by noting, for each value of the current ramp, the corresponding resistance of the conducting filament.

In one embodiment of steps F2 to F4, the simulation of the retention curves of the "ON" state and the determination of the initial resistance $R_{ON-i}$ are carried out by dichotomy. During a first iteration, the retention of a filament having a width L chosen arbitrarily is simulated. If the final resistance of this filament, at $t=t_{ret}$, is greater than the expected maximal resistance $R_{ON-f}$ then the width of the filament is increased for the following iteration. This will have the effect of lowering the retention curve, by choosing a lower initial resistance $R_{ON-i}$. If on the contrary the final resistance $R_{ON}(t_{ret})$ is less than the value $R_{ON-f}$ then the width of the filament is reduced for the following iteration. Then, this manner is continued by successive iterations until the algorithm converges and the initial resistance $R_{ON-i}$ (at t=0) is obtained corresponding to the threshold $R_{ON-f}$ (at $t=t_{ret}$).

The width of the filament is for example multiplied by two from one iteration to the next, when the resistance $R_{ON}(t_{ret})$ is too high. When the resistance $R_{ON}(t_{ret})$ is on the contrary too low, the new width may be equal to the average of the widths of two preceding iterations.

The determination of the programming parameter of the "OFF" state takes place in an analogous manner to steps F2 to F5 described previously, through the following steps F6 to F9:

F6: retention curves of the "OFF" state are simulated corresponding to different dimensions of filament, each retention curve now representing the reduction in resistance in the insulating state $R_{OFF}$ as a function of time t;

F7: among all the retention curves $R_{OFF}(t)$ the curve reaching the minimum value $R_{OFF-f}$ is determined, after a retention time t equal to the target retention time $t_{ret}$ (this curve being unique for the same reasons as mentioned previously);

F8: the initial value $R_{OFF-i}$ is determined from this retention curve, for example by noting its Y-intercept; and F9: the programming parameter of the "OFF" state is determined, for example by means of an abacus, from the initial value $R_{OFF-i}$.

In an embodiment, the retention curves of the "OFF" state simulated at step F6 correspond to different initial heights h of residual filament. The programming parameter of the "OFF" state is, for example, an erase voltage $V_{RST}$ applied to the terminals of the memory cell, that is to say between the cathode and the anode.

The simulation of the retention curves of the "OFF" state and the determination of the initial resistance $R_{OFF-i}$ (steps F6 to F8) may also be carried out by dichotomy, via an algorithm similar to that described previously for steps F2 to F4. From one iteration to the next, the height h of the residual filament will be reduced when the final resistance of this filament $R_{OFF}$ (t=$t_{ret}$) is less than the minimal expected resistance $R_{OFF-f}$ and increased if, on the contrary, the resistance $R_{OFF}(t_{ret})$ is greater than the value $R_{OFF-f}$.

FIG. 6 is an example of abacus used at step F9. This abacus represents the function $R_{OFF-i}$ ($V_{RST}$). In a similar manner to that of FIG. 5, it may be established by applying a voltage ramp $V_{SET}$ to a reference CBRAM memory cell and by plotting, for each value of the voltage ramp, the corresponding resistance $R_{OFF-i}$ of the residual filament.

Apart from the influence of the writing conditions on the retention of the "ON" state and the influence of the erasement conditions on the retention of the "OFF" state, the inventors have noticed that these writing conditions have an influence on the next erased state. In other words, the higher the current $I_{SET}$ in the SET phase, the more unstable will be the following "OFF" state. Consequently, for a high current $I_{SET}$, it will be desirable to provide a higher RESET $V_{RST}$ voltage than with a low current $I_{SET}$, in order to guarantee the retention of the "OFF" state.

For this reason, it is more beneficial to determine firstly the programming parameter of the "ON" state (step F2 to F5), before determining the programming parameter of the "OFF" state (step F6 to F9).

At the end of step F3, the resistance curve satisfying the retention criteria of the "ON" state, $R_{ON-f}$ and $t_{ret}$, is obtained. Since each simulated curve corresponds to a particular width of filament, it is possible to determine, at the same time as the initial resistance $R_{ON-i}$ at step F4, the corresponding width of filament $L_{opt}$. Since the terms $L_{opt}$ and $R_{ON-i}$ are linked by the above relation (1), they can also be deduced from each other in an additional step of the determination method.

The width $L_{opt}$ is optimal because it makes it possible to achieve the desired retention, while minimising electrical consumption. An even wider width of filament could indeed be provided, but the SET current to obtain it would be correspondingly greater.

After having determined the optimal width of filament $L_{opt}$, this is beneficially used in the retention analysis of the "OFF" state carried out at step F6. Indeed, this width is retrieved at the level of the residual filament in the erased state, because the erase voltage $V_{RST}$ only impacts the height h of the residual filament. The retention curves of the "OFF" state are thus beneficially simulated, at step F6, for a filament having an initial width equal to the optimal width $L_{opt}$ and for a variable initial height h.

Thus, the value of $R_{OFF-i}$ determined at step F8 corresponds to a particular morphology of the filament (width and residual height) induced both by the resistance $R_{ON-i}$ (itself arising from the threshold $R_{ON-f}$) and by the expectations for the retention of the "OFF" state (threshold $R_{OFF-f}$). The method can determine in addition to the optimal width $L_{opt}$ the residual height $h_{opt}$, of filament corresponding to the resistance $R_{OFF-i}$.

At the end of the method of FIG. 3, programming conditions respecting both the retention of the "ON" state (that is to say the threshold $R_{ON-f}$) and the retention of the "OFF" state ($R_{OFF-f}$) have been determined. This result may be obtained systematically thanks to the method according to an embodiment of the invention, but factors other than retention can constrain the choice of the programming conditions, especially technological limitations or managing electrical consumption.

For example, the miniaturisation of electrodes does not always allow to use high filament widths. It may also be difficult to completely erase the filament, without risking destroying the memory cell. Finally, in order to obtain a wide filament having a low resistance $R_{ON}$ (and thus stable), it is desirable to be able to apply a high current $I_{SET}$. Yet, this current also circulates during the erasement of the memory cell. Combined with a high erase voltage $V_{RST}$, it leads to high electrical power consumption. Finally, jointly with this question of electrical consumption is posed the problem of the dimensioning of access transistors enabling the application of these high voltages and currents.

The simulations and calculations of the method of FIG. 3 are performed with a programmed calculator. Each retention curve of the "ON" state or of the "OFF" state may be established with a model implemented by computer. An embodiment of a numerical model is described below, in relation to FIGS. 7A to 7D. It may be broken down into four steps.

The first step simulates, with a diffusion model, the movement of the atoms constituting the filament between two times $t_0$ and $t_1$ (FIGS. 7A and 7B respectively). In this diffusion model, the atoms of the filament are managed individually and the electrolyte layer is likened to a matrix.

Each atom is firstly placed in the matrix, in order to recreate the initial shape of the filament: an entire filament in the conducting "ON" state or a truncated filament in the insulating "OFF" state, depending on the retention curve to be obtained.

FIG. 7A represents an electrolyte 2 with a matrix shape (situated between the electrodes 3 and 4) comprising, as an example, a residual filament 6 in its initial state (t=$t_0$=0). The interatomic distance, that is to say the distance separating two consecutive atoms, may be set at 0.2 nm whatever the technology of the memory, in order to simplify the model.

Alternatively, the interatomic distance may be variable depending on the nature of the material that composes the filament, for example copper or silver in the case of a metal. In this case, it is equal to two times the covalence radius of the element. The model will be more precise, since adapted to the nature of the filament.

For the placement of the atoms in the matrix, the composition of the filament may be considered as planar, that is to say that the number of atoms at the centre of the filament is identical to the number of atoms on the edges. This choice makes it possible to obtain good results, without extending the calculation time. The composition may also be chosen "pseudo-cylindrical". This choice makes it possible to simulate the behaviour of a cylindrical filament, by considering that the number of atoms at the centre of the rectangular filament (simulations in 2 dimensions) is greater than the number of atoms on the edges. The "pseudo-cylindrical" composition has the benefit of giving more precise results in the case of a cylindrical filament, especially for large diameters, (L>3 nm), but requires a longer calculation time.

The placement of the atoms of the initial residual filament may not be as simplified as that represented in FIG. 7A. For example, it is possible to provide in the matrix a residual concentration of atoms above the filament 6. The same applies for an intact filament in W the initial "ON" state, the concentration of atoms being able to vary from one spot to the other of the filament.

After having represented the filament in the matrix, a thermal diffusion vector $\vec{d}$ is applied to each atom, which will have the effect of moving it in the matrix. Preferably, this movement is random and sampled at each second.

The diffusion vector $\vec{d}$ has two components $\vec{d_x}$ and $\vec{d_y}$ in the sectional plane of FIG. 7A. For "random" diffusion, the two components $\vec{d_x}$ and $\vec{d_y}$ are written:

$$\vec{d_x} = \sqrt{2D} \cdot \text{Rand}(\vec{x})$$

$$\vec{d_y} = \sqrt{2D} \cdot \text{Rand}(\vec{y})$$

$\vec{d_x}$ and $\vec{d_x}$ are the diffusion vectors along the directions $\vec{x}$ and $\vec{y}$ of FIG. 7A, Rand is a function for generating random numbers, according to a normal distribution law, and D is the diffusion coefficient.

The diffusion coefficient D follows an Arrhenius law:

$$D = D_0 \cdot \exp\left(-\frac{E_A}{kT}\right)$$

where $D_0$ is the Diffusivity pre-factor, $E_A$ is the activation energy, k is the Boltzmann constant (k=1,381.10$^{-23}$ J·K$^{-1}$) and T designates the measurement temperature (at which the dissolution of the filament is simulated).

By applying the diffusion vector $\vec{d}$, the model can place at each instant the atoms within the matrix of the electrolyte 2. FIG. 7B represents as an example the distribution of the atoms within the matrix after a time $t_1$ greater than $t_0$ ($t_1 > 0$).

Figure 7C:
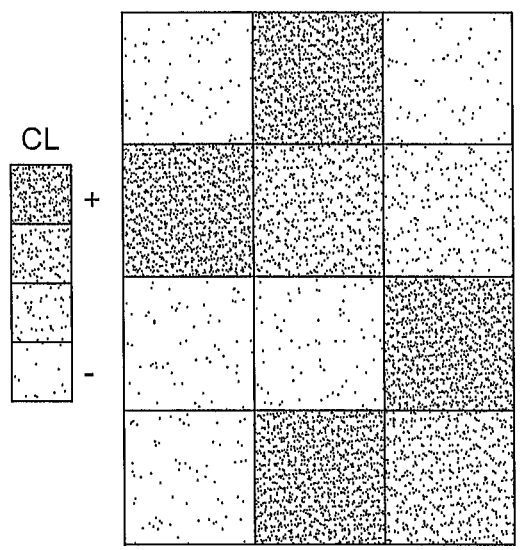
FIG. 7C represents the concentration of atoms of the metal filament in the electrolyte layer of FIG. 7B.
Figure 7D:
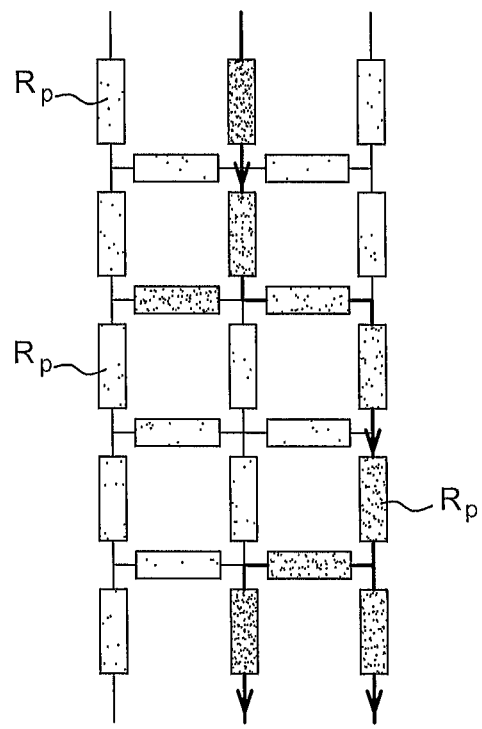
FIG. 7D represents a network of electrical resistances equivalent to the distribution of atoms of FIG. 7B.

During the second step, the model calculates the local concentrations $C_L$ of metal atoms in the different zones of the layer of electrolyte 2. For this, the electrolyte 2 is once again cut up to form a grid, a unit cell representing for example a surface area of 0.01 nm$^2$ and being able to contain several atoms, then the atoms in each unit cell are counted. FIG. 7C illustrates, for different degrees of filling, the atoms concentration $C_L$ obtained according to the matrix of the electrolyte at time $t_1$ (FIG. 7B).

The atoms concentration (number per surface unit) of a unit cell is beneficially averaged with the atoms concentrations of neighbouring unit cells (for example, over a distance of 5 unit cells), in order to take into account the influence of neighbouring atoms on the electrical conduction.

From the local atoms concentration $C_L$, it is possible to calculate, during a third step, the electrical resistivity $\rho_L$ in each unit cell. This calculation is carried out by mean of an electrical conduction model, such as the following relation:

$$\rho_L = \frac{1}{q \cdot \mu \cdot C_L}$$

μ being the charge carrier mobility and q the elementary charge (q=1.6.10$^{19}$ cm$^{-3}$).

Finally, during the fourth step represented in FIG. 4D, an overall resistance $R_{OFF}$ (or $R_{ON}$ for the study of the "ON" state) of the memory is calculated from the local electrical resistivities $\rho_L$ in the different unit cells of the electrolyte layer.

This may be done by calculating beforehand the passage resistances $R_P$ between two adjacent unit cells, and this is done for each pair of unit cells. Each passage resistance $R_P$ may be derived from the local resistivities $\rho_L$ of two adjacent unit cells and the distance separating the centre of these unit cells (here 0.2 nm). The passage resistances $R_P$ are interconnected and form a network, the equivalent resistance of which is equal to the resistance $R_{OFF}(t_1)$.

To obtain a retention curve, these four steps are implemented for several retention times t, such that several overall resistance values $R_{OFF}$ are obtained, staggered over time.

The above numerical model involves the charge carriers mobility μ and the diffusion coefficient D. These parameters μ and D depend on the CERAM technology used and may not be known. A technique enabling them to be determined is thus proposed.

In order to determine the coefficient D, a retention study of the written state is carried out at a first temperature T1, for two initial resistance values $R_{ON-i}$ (i.e. two widths of filaments), R1 and R2. This experimental study allows to obtain two values of the retention coefficient, represented by the slope of each curve.

Figure 8:
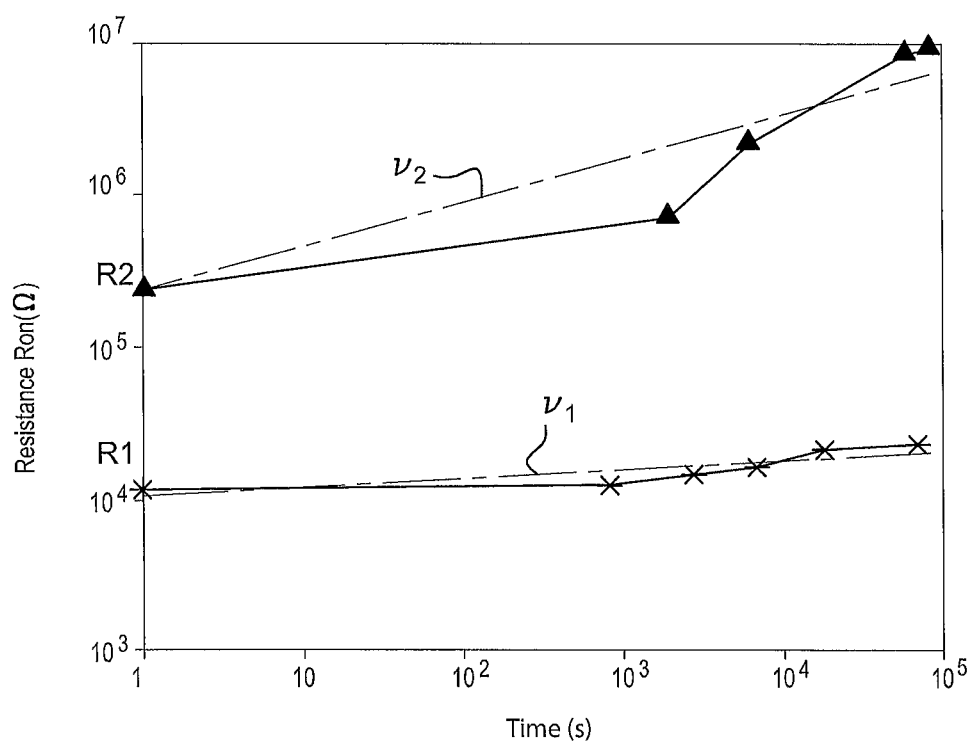
FIG. 8 represents two retention curves of the "ON" state of a resistive memory at a first temperature.

FIG. 8 represents by way of example two retention curves of the "ON" state obtained at the temperature T1 of 130° C. and having for initial resistances R1=1.2.10$^4$Ω and R2=2.3.10$^5$Ω. v1 and v2 are the retention coefficients associated with the two resistance curves. They have been obtained by linear regression and equal respectively: v1=5.10$^{-2}$ Ω·s$^{-1}$ and v2=3.5.10$^{-1}$ Ω·s$^{-1}$.

Thanks to the relation (1) linking the initial resistance $R_{ON-i}$ to the width L of the filament, the ratio of the widths L1 and L2 corresponding to the resistances R1 and R2 is determined:

$$R1 = \frac{\rho \cdot h}{L1} = 1,2 \cdot 10^4 \Omega$$

$$R2 = \frac{\rho \cdot h}{L2} = 2,3 \cdot 10^5$$

hence:

$$\frac{L2}{L1} = \frac{R1}{R2} = 0.05$$

i.e.:

$$\frac{1}{L2} = 20 \cdot \frac{1}{L1} \tag{2}$$

Then, a graph representing the retention coefficient v as a function of the thermal diffusion coefficient D and the inverse of the width 1/L is produced. This graph is, in an embodiment, obtained using the same numerical model as described previously, except for fixing in this model an arbitrary mobility value (because the "real" value still has to be determined). The model thus simulates a multitude of retention curves at the temperature T1, by varying the width L of the filament and the parameter D, then calculates the corresponding slopes.

Figure 9:
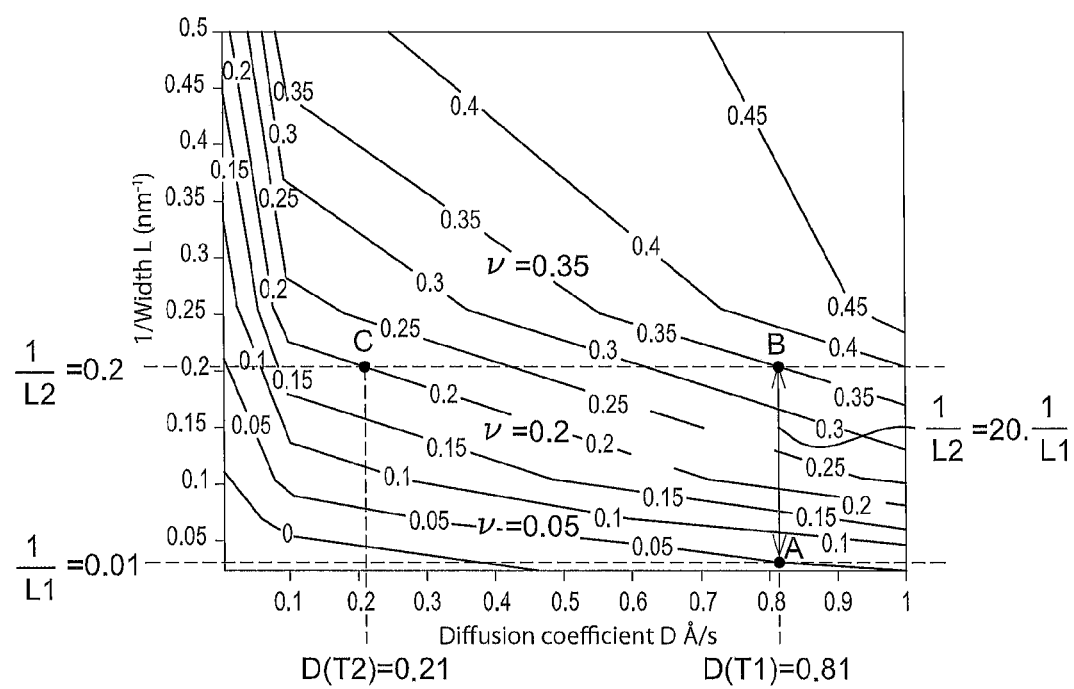
FIG. 9 represents a series of iso-slope curves, as a function of the diffusion coefficient D and of the inverse of the width of the filament 1/L.

FIG. 9 represents such a graph, in the form of a series of iso-slope curves. Each iso-slope curve represents the group of values combinations {D, 1/L} having for retention coefficient the value indicated on the curve. The thermal diffusion coefficient D, on the x-axis, varies from 0 to 1 Å·s$^{-1}$, and the inverse of the width L, on the y-axis, varies from 0 to 0.5 nm$^{-1}$.

Thanks to the retention analysis carried out at the temperature T1, two values v1 and v2 of retention coefficient and a relation (2) linking the widths of filament L1 to L2 are available. Then, in the graph of FIG. 9, the points A and B are searched for belonging respectively to the iso-slope curves v1=5.10$^{-2}$ Ω·s$^{-1}$ and v2=5.10$^{-2}$ Ω·s$^{-1}$ and for which the respective ordinates 1/L1 and 1/L2 verify the relation (2). The thermal diffusion coefficient D, at the temperature T1, is then given by the abscissa of the points A and B. In this example, D(T1) is equal to 0.81 Å·s$^{-1}$.

Points A and B have the same abscissa D, because they correspond to the same temperature T1 and thus to the same diffusion coefficient (the activation energy $E_A$ being assumed constant). The graph of the iso-slope curves thus allows to determine a first value of the diffusion coefficient D(T1), by means of two retention curves $R_{ON}(t)$ simulated at the same temperature T1, and more particularly from the Y-intercepts and slopes of these two curves.

The choice of an arbitrary mobility value μ to establish the iso-slope curves is not detrimental because, by calculating the ratio of the widths L1 and L2 and by transferring it to the graph of FIG. 9, this mobility no longer plays any part.

In order to determine the parameter D for any temperature, and not only at the temperature T1, a second temperature retention study is carried out. In this second study, the behaviour of an "ON" state identical to one of the two preceding "ON" states is observed, that is to say the behaviour of a filament having an initial resistance equal to R1 or R2, but at a second temperature T2 different to T1. Thus, unlike the preceding analysis, the resistance is fixed and the temperature is variable. A second value of the retention coefficient (at the new temperature T2) will then be obtained, for the same filament.

As an example, the filament chosen is that having a width L2 (and thus an initial resistance R2). The retention curve plotted at the temperature T2 of 75° C. has a slope v1' equal to 2.0.10$^{-1}$ Ω·s$^{-1}$.

In the graph of FIG. 9, it is then possible to show a third point C having the same ordinate as the point B and situated on the iso-slope curve v1'=2.10$^{-2}$ Ω·s$^{-1}$. The abscissa of the point C corresponds to the value of the diffusion coefficient D at the temperature T2. This gives here: D(T2)=0.21 Å·s$^{-1}$.

From the values D(T1) and D(T2), it is possible to extract the activation energy $E_A$ and the pre-exponential factor $D_0$ contained in the relation of the diffusion coefficient D. For this, it suffices to resolve the following system of equations:

$$D(T1) = D_0 \cdot \exp\left(-\frac{E_A}{kT1}\right)$$

$$D(T2) = D_0 \cdot \exp\left(-\frac{E_A}{kT2}\right)$$

The coefficient D is then determined for any temperature T, by replacing $E_A$ and $D_0$ by their respective values, 0.28 eV and 2550 Å·s$^{-1}$:

$$D(T) = 2550 \cdot \exp\left(-\frac{0.28}{kT}\right)$$

Finally, in order to determine the mobility value μ, another system of equations based on Ohm's law is resolved, knowing the resistances R1, R2 and the corresponding widths L1, L2:

$$R1 = \frac{\rho \cdot h}{L1} = \frac{1}{\mu \cdot n \cdot q} \frac{h}{L1}$$

-continued $$R2 = \frac{\rho \cdot h}{L2} = \frac{1}{\mu \cdot n \cdot q} \frac{h}{L2}$$

n being the concentration (unknown) of charge carriers.

In the example of FIG. 9, L1 is equal to 100 nm and L2 is equal to 5 nm for respectively R1=1.2.10$^4$Ω and R2=2.3.10$^5$Ω. The mobility μ is then equal to 1.8.10$^{13}$ V$^{-1}$ s$^{-1}$.

Having described and illustrated the principles of the invention with reference to various embodiments, it will be recognized that the various embodiments can be modified in arrangement and detail without departing from such principles. It should be understood that the programs, processes, or methods described herein are not related or limited to any particular type of computing environment, unless indicated otherwise. Various types of specialized computing environments may be used with or perform operations in accordance with the teachings described herein. Elements of embodiments shown in software may be implemented in hardware and vice versa.

One or more devices, processors or processing devices may be configured to execute one or more sequences of one or more machine executable instructions contained in a main memory to implement the method(s) described herein. Execution of the sequences of instructions contained in a main memory causes the processor to perform at least some of the process steps described herein. One or more processors in a multi-processing arrangement may also be employed to execute the sequences of instructions contained in a main memory. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to a processor for execution. Such a medium may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor for execution.

The computer program comprising machine executable instructions for implementing the method can be implemented by a computer comprising at least an interface, a physical processor and a non-transitory memory (also broadly referred to as a non-transitory machine readable or storage medium). The computer is a special purpose computer as it is programmed to perform the specific steps of the method. The non-transitory memory is encoded or programmed with specific code instructions for carrying out the above method. The non-transitory memory is arranged in communication with the physical processor so that the physical processor, in use, reads and executes the specific code instructions embedded in the non-transitory memory.

The interface of the special purpose computer is arranged in communication with the physical processor and receives input parameters that are processed by the physical processor.

It will be appreciated by one skilled in the art that the method of FIG. 3 and other methods described herein represent a solution to the technological problem currently faced by circuit designers as it/they enable(s) one to guarantee the stability of the conducting and insulating states of a resistive random access memory, over a given retention time. This improves their electrical performance.

The invention claimed is:

1. A method for determining electrical parameters for programming a resistive random access memory in an insulating state and in a conducting state, said memory comprising first and second electrodes separated by a layer made of electrically insulating material, and passing from the insulating state to the conducting state by formation of a conducting filament between the first and second electrodes, the method comprising:

supplying a set of parameters comprising a target retention time of the insulating and conducting states, a maximum resistance value in the conducting state and a minimum resistance value in the insulating state;

simulating retention curves of the conducting state corresponding to different dimensions of the conducting filament, each retention curve of the conducting state representing an increase in resistance in the conducting state as a function of a retention time;

determining the retention curve of the conducting state reaching the maximum resistance value in the conducting state after a retention time equal to the target retention time;

determining an initial resistance value in the conducting state from said retention curve of the conducting state;

determining the programming parameter of the conducting state from the initial resistance value in the conducting state;

simulating retention curves of the insulating state corresponding to different dimensions of the conducting filament, each retention curve of the insulating state representing the reduction in resistance in the insulating state as a function of the retention time;

determining the retention curve of the insulating state reaching the minimum resistance value in the insulating state after a retention time equal to the target retention time;

determining an initial resistance value in the insulating state from the retention curve of the insulating state;

determining the programming parameter of the insulating state from the initial resistance value in the insulating state.

2. The method according to claim 1, wherein the initial resistance value in the conducting state is obtained by determining a Y-intercept of said retention curve of the conducting state and wherein the initial resistance value in the insulating state is obtained by determining a Y-intercept of said retention curve of the insulating state.

3. The method according to claim 1, wherein the retention curves of the conducting state correspond to different initial widths of filament, the filament having an initial height equal to the thickness of the layer made of electrically insulating material.

4. The method according to claim 3, comprising determining an optimal width of filament corresponding to said retention curve of the conducting state.

5. The method according to claim 4, wherein the retention curves of the insulating state are simulated for a filament having an initial width equal to the optimal width and a variable initial height.

6. The method according to claim 1, wherein the first electrode is made of an inert material, the second electrode is made of a soluble material and the electrically insulating material is an ion conducting material, the conducting filament being formed of atoms of the material of the soluble electrode.

7. The method according to claim 6, wherein the retention curves of the conducting state and of the insulating state are obtained by carrying out, for different retention times, the following steps:

simulating a diffusion of the atoms forming the filament;

calculating the concentration of atoms in different portions of the layer made of electrically insulating material;

calculating, from the concentration of atoms, the equivalent electrical resistivity in each portion; and calculating an overall resistance of the memory from the equivalent electrical resistivities of the different portions of the layer made of electrically insulating material.

8. A computer readable medium comprising machine executable instructions for implementing a method according to claim 1.

* * * * *